United States Patent [19]
Barakat et al.

[11] Patent Number: 5,898,455
[45] Date of Patent: Apr. 27, 1999

[54] INTERFACE MODULES AND METHODS FOR COUPLING COMBINED COMMUNICATION SIGNALS TO COMMUNICATION RECEIVERS

[75] Inventors: Nader A. Barakat, Moorpark; Dana F. Brady, Ventura, both of Calif.

[73] Assignee: California Amplifier, Inc., Camarillo, Calif.

[21] Appl. No.: 09/079,115

[22] Filed: May 14, 1998

Related U.S. Application Data

[60] Provisional application No. 60/068,589, Dec. 23, 1997.

[51] Int. Cl.$^6$ ....................................................... H04N 7/10
[52] U.S. Cl. ................................ 348/6; 455/3.2; 455/6.3; 455/180.1; 455/190.1; 348/8
[58] Field of Search ........................... 455/3.2, 6.2, 6.3, 455/131, 190.1, 189.1, 180.1, 5.1, 4.2, 6.1, 313, 314; 348/10, 8, 7, 12, 13

[56] References Cited

U.S. PATENT DOCUMENTS 4,419,768  12/1983  Yamashita et al. .................. 455/180.1
5,437,051   7/1995  Oto ........................................... 455/3.2

OTHER PUBLICATIONS

Dr. Frank Baylin, *Digital Satellite TV*, fifth edition, 1997, Boulder, Colorado, pp. 92,93 and 159–163.

*Primary Examiner*—Andrew I. Faile
*Assistant Examiner*—Sam Huang
*Attorney, Agent, or Firm*—Koppel & Jacobs

[57] ABSTRACT

Interface modules are disclosed that can couple combined signals in communication signal bands (e.g., cable television and upper and lower direct broadcast satellite signal bands) to communication receivers (e.g., integrated receiver decoders). These modules facilitate the use of inexpensive single-cable distribution systems in multiuser facilities (e.g., apartment and office buildings).

20 Claims, 4 Drawing Sheets

INTERFACE MODULES AND METHODS FOR COUPLING COMBINED COMMUNICATION SIGNALS TO COMMUNICATION RECEIVERS

CROSS REFERENCES TO RELATED APPLICATIONS

This application claims the benefit of U.S. Provisional Application Ser. No. 60/068,589 filed Dec. 23, 1997.

BACKGROUND OF THE INVENTION

1. Field of the Invention

The present invention relates generally to combined communication signals and more particularly to combined CATV and DBS signals.

2. Description of the Related Art

A signal-band diagram 20 of FIG. 1 defines frequencies that are associated with a variety of communication services that deliver communication signals to consumers. In the oldest of these communication services, off-air television and frequency modulation signals are typically received through a consumer antenna. The majority of these off-air signals are arranged in a plurality of signal bands that range from 54 to 216 MHz and are shown in broken lines as bands 22 in FIG. 1.

In a second one of these services, communication signals are provided by a wireless cable system in which signals are directed from a service provider's antenna to a plurality of subscriber antennas. The signals are sent over the multipoint distribution service (MDS) frequency band (2150–2162 MHz) and the multichannel multipoint distribution service (MMDS) frequency band (2500–2686 MHz). Signals in these wireless cable bands are typically downconverted at subscriber dwellings by low noise block downconverters (LNB's) to form MDS and MMDS intermediate-frequency bands that respectively span 116–128 MHz and 222–408 MHz. These are respectively shown in broken lines as bands 24 and 26 in FIG. 1.

Consumers are also offered the alternative of cable television (CATV) in which hard cables deliver television and frequency modulation signals to consumer locations over a signal band of 54–648 MHz.

The communication signals provided by these three communication systems were initially limited to television and frequency modulation signals. Consumers are now being offered, however, an increasing list of other communication options. For example, a communication service can carry telephony signals and also operate as an internet service provider (ISP) who provides access to the internet. It was also initially envisioned that signals were only downlinked to consumers but some of these communication services have now become two-way streets in which consumers uplink data signals (e.g., signals associated with the activities of pay-for-view, banking, home shopping, medical alarm and fire/security).

To provide for both uplink and downlink processes, a CATV signal band is generally defined to span 5–750 MHz and includes an uplink signal band of 5–30 MHz for consumer uplinking of data signals and a downlink signal band of 50–750 MHz for provider downlinking of communication signals. The CATV signal band is shown in FIG. 1 as the band 28.

Consumers can presently also choose to receive communication signals from a direct broadcast satellite (DBS) system. In this system, satellites radiate microwave signal beams in C-band and Ku-band frequencies. Upon direct receipt at a consumer antenna, these satellite signals are initially downconverted to an intermediate-frequency signal band of 950–1450 MHz before further downconversion and detection at a lower detection frequency.

To increase their number, DBS channels are typically grouped in two sets which each basically span the same DBS band but each channel of one set is centered over a boundary between adjacent channels of the other set. In order to further isolate the sets, they are transmitted with different signal polarizations (e.g., vertical and horizontal polarizations or left-hand and right-hand circular polarizations). Once the transmitted signals are detected in an antenna, the polarization isolation is lost and the two intermediate-frequency signal bands must either be carried on separate transmission lines (e.g., coaxial cables) or carried on a common transmission line after one channel set has been frequency offset from the other.

In either case, DBS signals present distribution problems. If the two DBS channel sets are carried away from an antenna on separate cables, these cables must be continued all the way to the consumer's equipment (e.g., a television set). This is especially difficult and costly in multiuser installations because it means that all link portions of a distribution system must be formed with pairs of cables.

If the intermediate-frequency channel sets are, instead, frequency offset, they typically form a lower DBS signal band of 950–1450 MHz and an upper DBS signal band of 1525–2025 MHz. These are respectively shown in FIG. 1 as DBS signal bands 30 and 32. These two signal bands can be carried over a single-cable distribution system because of their frequency separation. Because the CATV signal band 28 of FIG. 1 also occupies a different frequency band, it can be carried over the same single-cable distribution system.

Television sets (and other communication devices) typically cannot receive CATV and DBS signals directly and they are, therefore, complimented by interface modules commonly referred to as "set tops". More precisely, these interfaces are generically termed integrated receiver decoders (IRD). Because they are generally configured to only accept the lower DBS signal band 30, they are not compatible with a single-cable distribution system that carries both DBS signal bands 30 and 32.

To summarize, communication signals for consumers are generally grouped into a CATV signal band (28 in FIG. 1) and lower and upper DBS signal bands (30 and 32 in FIG. 1). They provide desirable communication services (e.g., television, internet and telephony) and facilitate downlink and uplink processes. However, these communication signal bands are not currently compatible with single-cable distribution systems.

Conventional efforts to resolve this incompatibility have generally involved the use of mechanical relay switches or IRD's which have been modified to receive the lower and upper DBS signal bands. The former effort accepts the low reliability and lifetime of mechanical switches and the IRD's of the latter effort are more expensive and still exclude CATV signals.

SUMMARY OF THE INVENTION

The present invention is directed to communication interface modules that can couple combined communication signals (e.g., signals in the CATV signal band 28 and lower and upper DBS signal bands 30 and 32 of FIG. 1) to communication receivers (e.g., IRD's). Because they can process combined signals, modules of the invention facilitate the use of inexpensive single-cable distribution systems in multiuser communication installations (e.g., apartment houses, condominium complexes, office buildings and the like).

In the exemplary case of CATV and DBS signals, these goals are realized with the formation of CATV, lower DBS and upper DBS signal paths. In particular, a CATV signal path is formed that passes signals in the CATV signal band and attenuates signals in the lower and upper DBS signal bands. A lower DBS signal path is provided that passes signals in the lower DBS signal band and attenuates signals in the upper DBS signal band and in the CATV signal band.

An upper DBS signal path is supplied that, a) initially passes signals in the upper DBS signal band and attenuates signals in the lower DBS signal band and in the CATV signal band, b) subsequently downconverts signals in the upper DBS signal band to the lower DBS signal band, and c) lastly, passes signals in the lower DBS signal band and attenuates signals in the upper DBS signal band. Subsequently, the combined signals are directed through the CATV signal path and either selected one of the lower and upper DBS signal paths to a communication receiver.

Interface modules of the invention facilitate the formation of single-cable receiving and distributing systems for multiuser facilities. For example, an antenna and a dual-band LNB can combine lower and upper DBS signals into a single cable. CATV signals can be added to the single cable through a summer. The summer and the interface modules can then be connected through a single-cable distribution network to interface modules of the invention.

The novel features of the invention are set forth with particularity in the appended claims. The invention will be best understood from the following description when read in conjunction with the accompanying drawings.

DETAILED DESCRIPTION OF THE PREFERRED EMBODIMENTS

Figure 1:
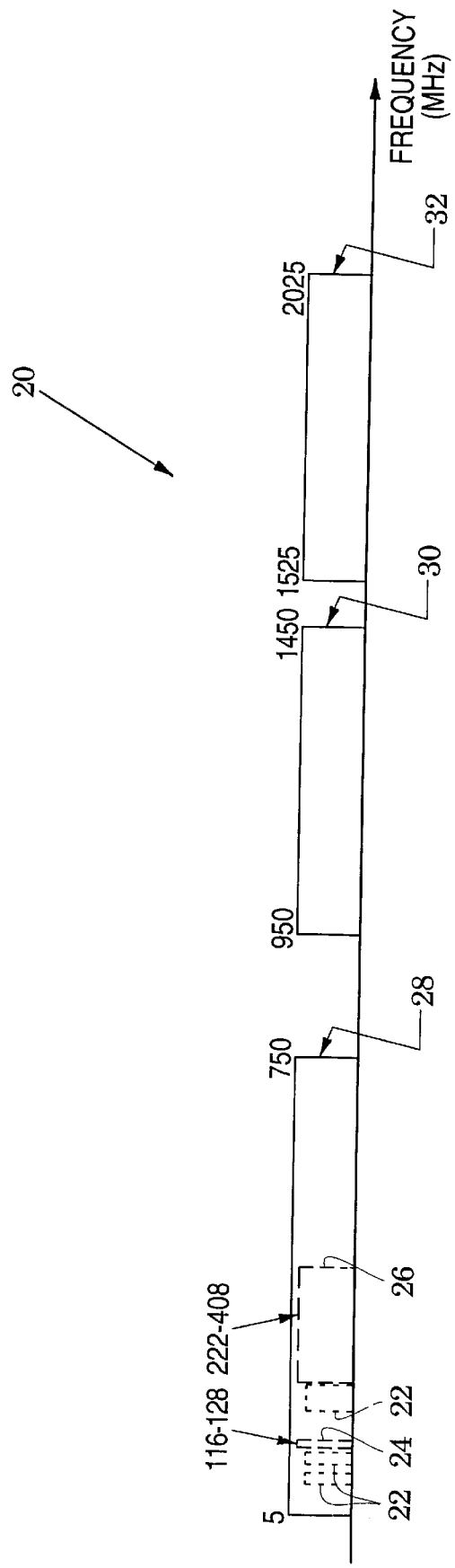
FIG. 1 is a diagram of frequency bands that are associated with conventional communication-signal delivery systems.
Figure 2:
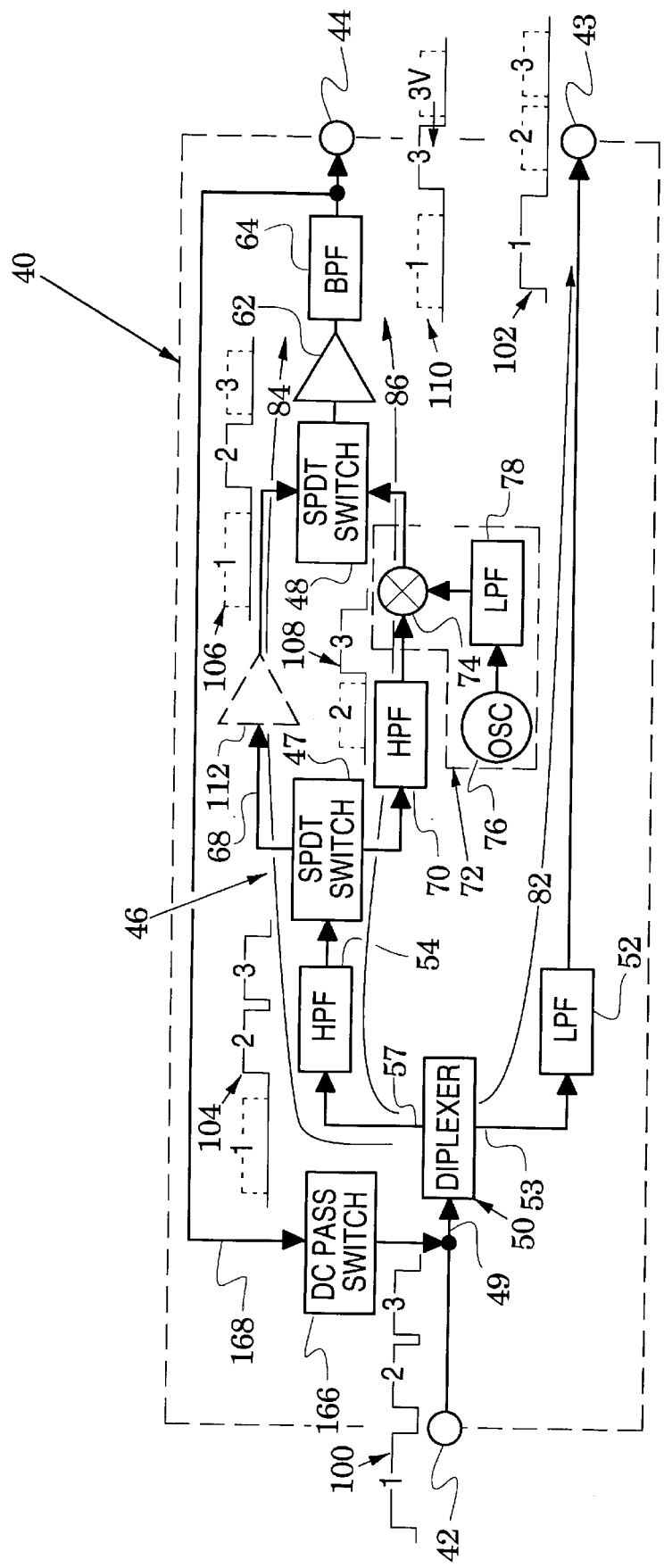
FIG. 2 is a block diagram of an interface module of the present invention for coupling combined communication signals to communication receivers.

FIG. 2 illustrates an interface module 40 that can couple combined signals of a CATV signal band and lower and upper DBS signal bands (i.e., the signal bands 28, 30 and 32 of FIG. 1) to a communication receiver (e.g., an IRD).

The module 40 has an input port 42, a CATV output port 43, a DBS output port 44 and a switching system 46 that is formed with single-pole double-throw switches 47 and 48. The CATV output port 43 and the DBS output port 44 are intended for coupling with corresponding input ports in conventional receivers.

The input port 42 is in common with the input 49 of a diplexer 50. A low-pass filter 52 is connected between an output 53 of the diplexer and the CATV output port 43. The switch 47 is connected to another output 57 of the diplexer 50 by a high-pass filter 54. The switch 48 is connected through an amplifier 62 and a bandpass filter 64 to the DBS output port 44.

A conductive signal path 68 connects an output terminal of the switch 47 and an input terminal of the switch 48. A high-pass filter 70 is connected to another output terminal of the switch 47 and the filter is connected through a downconverter 72 to another input terminal of the switch 48. The downconverter is formed by a mixer 74, an oscillator 76 and a low-pass filter 78 that is coupled between the mixer and the oscillator.

In describing operation of the interface module 40, it is helpful to note that elements of the module form a CATV signal path 82, a lower DBS signal path 84 and an upper DBS signal path 86 as shown in FIG. 2. The CATV signal path 82 couples the input port 42 and the CATV output port 43. The lower DBS signal path 84 and the upper DBS signal path 86 each couple the input port 42 and the DBS output port 44 and either of these DBS paths can be selected with the switching system 46.

Figure 3:
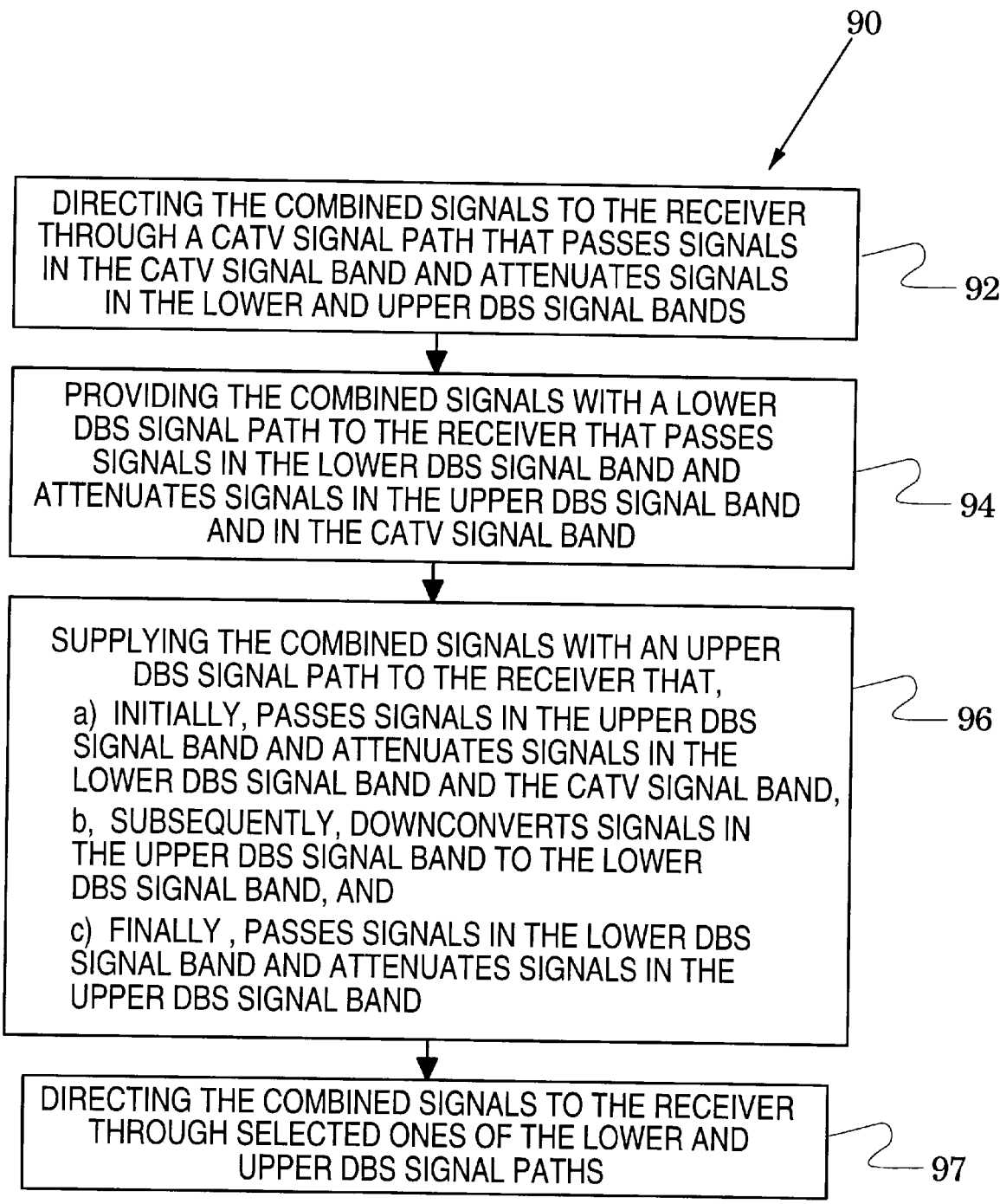
FIG. 3 is a flow chart that illustrates process steps in the interface module of FIG. 2.

In terms of the signal paths 82, 84 and 86, interface modules of the invention couple combined signals to a receiver with processes of the flow chart 90 of FIG. 3. A first process step 92 of this flow chart describes the CATV signal path 82 as one that passes signals in the CATV signal band and attenuates signals in the lower and upper DBS signal bands. In this process step, the combined signals are directed through the CATV signal path to the receiver.

A second process step 94 provides a lower DBS signal path (i.e., the signal path 84 in FIG. 2) that passes signals in the lower DBS signal band and attenuates signals in the upper DBS signal band and the CATV signal band.

A third process step 96 supplies an upper DBS signal path (i.e., the path 86 in FIG. 2) that initially passes signals in the upper DBS signal band and attenuates signals in the lower DBS signal band and in the CATV signal band. Subsequently, this path downconverts signals in the upper DBS signal band to the lower DBS signal band. Finally, this path passes signals in the lower DBS signal band and attenuates signals in the upper DBS signal band.

In the process step 97, the combined signals are directed to the receiver through either selected one of the lower and upper DBS signal paths 84 and 86.

The interface module 40 of FIG. 2 embodies the processes of the flow chart 90 of FIG. 3. In particular, the CATV signal path 82 includes the low-pass filter 52 that processes signals in accordance with process step 92 of FIG. 3. In addition, the structure of the module 40 directs the combined signals through the signal path 82 as recited in process step 90.

The lower DBS signal path 84 includes the high-pass filter 54, the amplifier 62 and the bandpass filter 64 that process signals in accordance with process step 94 of FIG. 3. This path can be selected with the switching system 46 as recited in process step 97.

The upper DBS signal path 86 has a first portion that includes high-pass filter 54 and high-pass filter 70. These filters process signals in accordance with part (a) of process step 96 of FIG. 3. The signal path 86 has a terminal portion that includes amplifier 62 and bandpass filter 64. These elements process signals in accordance with part (c) of process step 94. In addition, the signal path 86 has a downconverter 72 that processes signals in accordance with part (b) of process step 94. Finally, the path 86 can be selected with the switching system 46 as recited in process step 97.

The processes of the interface module 40 are further illustrated with diagrams of signal bands that exist at various points in the module. A first signal band diagram 100 shows the combination of a CATV signal band, a lower DBS signal band and an upper DBS signal band at the input port 42. These bands correspond to the signal bands 28, 30 and 32 of FIG. 1 but to simplify the following description, they are respectively labeled 1, 2 and 3 in FIG. 2.

After passage through low-pass filter 52, the signal path 82 only couples signal band 1 to the CATV output port 43 as shown by signal band diagram 102. Signal bands 2 and 3 are shown in broken lines to illustrate that they have been attenuated.

After passage through high-pass filter 54, signal paths 84 and 86 retain signal bands 2 and 3 and signal band 1 has been attenuated as shown by signal band diagram 104. After passage through bandpass filter 64, the signal path 84 delivers signal band 2 and signal bands 1 and 3 have been attenuated as shown by signal band diagram 106.

After passage through high-pass filter 70, the signal path 86 retains signal band 3 while signal bands 1 and 2 have been attenuated as shown in signal band diagram 108. After passage through downconverter 72, amplifier 62 and bandpass filter 64, the retained signal band 3 has been translated down to the position of signal band 2 as shown by signal band diagram 110. The vacated position of signal band 3 is shown as signal band 3V.

The concepts inherent in the interface module 40 of FIG. 2 can be modified to form interface variations that are still in accord with the teachings of the invention. Amplifiers can be moved, deleted and added and passbands of various filters altered while still realizing the processes of FIG. 3. As a first example, amplifier 62 might be removed and replaced by amplifiers in other paths, e.g., the amplifier 112 shown in broken lines. As a second example, passbands of various filters can be altered (e.g., the bandpass filter 64 could be changed to a low-pass filter).

Although the oscillator 76 of the downconverter 72 could generate a "high side" converter signal, it preferably generates a "low side" converter signal of 575 MHz so that signal bands are not inverted in the dowconversion process. Frequency inversion may corrupt specific downlink and uplink processes. In addition, oscillator harmonics that can cause undesirable mixing products are blocked from the mixer 74 by the low-pass filter 78.

Elements of the interface module 40 can be realized with various specific circuits. For example, an exemplary oscillator 76 for the upconverter 72 is an oscillator that is phase-locked to a crystal to enhance its stability and spectrum.

Figure 4:
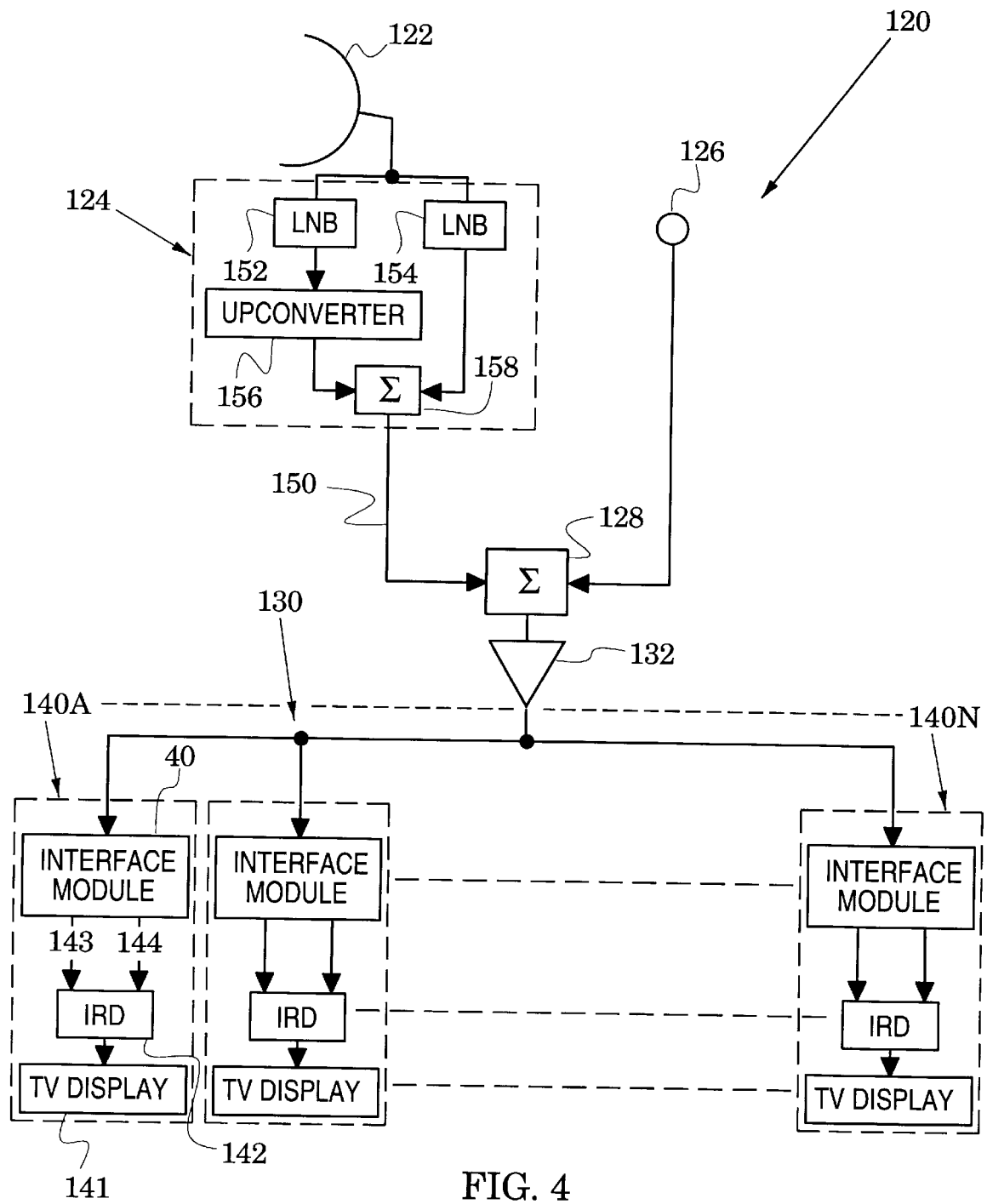
FIG. 4 is a block diagram of a communication-signal receiving and distributing system of the present invention.

Interface modules of the invention facilitate the formation of efficient, inexpensive, single-cable receiving and distributing systems, e.g., the system 120 that is illustrated in FIG. 4. The system 120 includes an antenna 122, a dual-band LNB 124 and a CATV input port 126. The dual-band LNB 124 and the input port 126 couple to a summer 128 that is connected to a single-cable distribution network 130 by a distribution amplifier 132.

The network 130 is arranged to distribute signals to various sites 140A–140N. The sites 140 can be, for example, apartments in an apartment house, units in a condominium or offices in an office building. Thus, the sites 140 represent situations in which it is desirable to service multiple users from a single antenna.

Each of the sites has a communication device (e.g., a television display) 141 that is connected to an IRD 142 and the IRD is connected to the network 130 by an interface module of the present invention, e.g., the module 40 of FIG. 2. The connection is made with a CATV cable 143 and a DBS cable 144 that couple respective ports of the IRD to the interface module's CATV and DBS ports (43 and 44 in FIG. 2).

Because it performs the signal coupling processes of flow chart 90 of FIG. 3, the interface module 40 can couple combined CATV and DBS signals to the IRD 142. Therefore, all link members of the distribution network 130 can be realized with single cables. In the absence of the interface module 40, each of these members would have to have as many as three transmission cables—one to carry CATV signals and two more to carry the lower and upper DBS signals. Alternatively, the DBS signals could be carried on one cable but this would require expensive IRD's that can accept both lower and upper DBS signal bands.

The dual-band LNB 124 can be of various conventional forms. As shown in FIG. 4, it can include first and second LNB's 152 and 154. Each of these is connected to a different probe in the antenna 122 to detect channel sets of different polarizations and downconvert them to the lower DBS signal band. After an upconverter 156 translates one of the signal sets to the upper DBS signal band, the sets can be combined in a summer 158. In a different dual-band LNB, the broken line box 124 represents an LNB that has a pair of downconverters operating with different local-oscillator frequencies. Thus, the lower and upper DBS signal bands are coupled together without the need for the upconverter 156. In either case, CATV and DBS signals at the output of the distribution amplifier 132 are grouped in the signal bands 28, 30 and 32 of FIG. 1).

Each interface module's switch system (46 in FIG. 2) can be automatically controlled with voltage control signals from its respective IRD 142.

Costs of LNB's are sometimes reduced by coupling a DC supply voltage to them on their output signal cable. Accordingly, the interface module 40 of FIG. 2 includes a DC pass switch 166 that can be set to complete a DC path 168 between the DBS port 44 and the input port 42. This provides a path for passage of an LNB supply voltage to the input port 42 (and from there, to the LNB 124 of FIG. 4).

The teachings of the invention have been described with reference to systems that combine CATV and upper and lower DBS signal bands. Other useful embodiments of the invention can be formed that combine only the upper and lower DBS signal bands (i.e., the CATV signal path is not included). Such an embodiment can be formed, for example, by removing the diplexer 50, the low-pass filter 52 and the output port 43 from the interface module 40 of FIG. 2.

The terms "pass" and "passband" have been used herein to refer to a band of frequencies which will pass through a filter with essentially no attenuation, i.e., passband is the frequency range in which a filter is intended to pass signals. This is in accord with conventional electronic practice (e.g., see Graf, Rudolf E., *Modern Dictionary of Electronics*, Macmillan Publishing, Carmel, Ind., sixth edition, p. 716).

The described embodiments of the invention are exemplary and numerous modifications, variations and rearrangements can be readily envisioned to achieve substantially equivalent results, all of which are embraced within the spirit and scope of the invention as defined in the appended claims.

We claim:

1. A method for coupling combined signals of a cable television (CATV) signal band and lower and upper intermediate-frequency direct broadcast satellite (DBS) signal bands to a receiver, the method comprising the steps of:

directing said combined signals to said receiver through a CATV signal path that passes signals in said CATV signal band and attenuates signals in said lower and upper DBS signal bands;

providing said combined signals with a lower DBS signal path that passes signals in said lower DBS signal band and attenuates signals in said upper DBS signal band and in said CATV signal band;

supplying said combined signals with an upper DBS signal path that:
  a) initially passes signals in said upper DBS signal band and attenuates signals in said lower DBS signal band and in said CATV signal band;
  b) subsequently downconverts signals in said upper DBS signal band to said lower DBS signal band; and
  c) finally passes signals in said lower DBS signal band and attenuates signals in said upper DBS signal band; and directing said combined signals to said receiver through either selected one of said lower and upper DBS signal paths.

2. The method of claim 1, wherein said supplying step includes the step of mixing signals in said upper DBS signal band with a mixing signal whose frequency is lower than said upper DBS signal band to, thereby, downconvert signals in said upper DBS signal band without frequency inversion.

3. The method of claim 1, wherein said directing step includes the step of switching either selected one of said upper and lower DBS signal paths to said receiver.

4. The method of claim 1, wherein said CATV signal band is the frequency band of 5–750 MHz, said lower DBS signal band is the frequency band of 950–1450 MHz and said upper DBS signal band is the frequency band of 1525–2025 MHz.

5. A method for coupling combined signals of lower and upper intermediate-frequency direct broadcast satellite (DBS) signal bands to a television receiver, the method comprising the steps of:

providing said combined signals with a lower DBS signal path to said receiver that passes signals in said lower DBS signal band and attenuates signals in said upper DBS signal band and in said CATV signal band;

supplying said combined signals with an upper DBS signal path to said receiver that:
  a) initially passes signals in said upper DBS signal band and attenuates signals in said lower DBS signal band and in said CATV signal band;
  b) subsequently downconverts signals in said upper DBS signal band to said lower DBS signal band; and
  c) finally passes signals in said lower DBS signal band and attenuates signals in said upper DBS signal band; and directing said combined signals to said receiver through selected ones of said lower and upper DBS signal paths.

6. The method of claim 5, wherein said supplying step includes the step of mixing signals in said upper DBS signal band with a mixing signal whose frequency is lower than said upper DBS signal band to, thereby, downconvert signals in said upper DBS signal band without frequency inversion.

7. The method of claim 5, wherein said CATV signal band is the frequency band of 5–750 MHz, said lower DBS signal band is the frequency band of 950–1450 MHz and said upper DBS signal band is the frequency band of 1525–2025 MHz.

8. An interface module for coupling combined signals of a cable television (CATV) signal band and lower and upper intermediate-frequency direct broadcast satellite (DBS) signal bands to a television receiver, the interface module comprising:

a diplexer having an input port for receiving said combined signals;

a CATV output port;

a DBS output port;

a CATV signal path between said diplexer and said CATV output port that passes signals in said CATV signal band and attenuates signals in said lower and upper DBS signal bands;

a lower DBS signal path that passes signals in said lower DBS signal band and attenuates signals in said CATV signal band and said upper DBS signal band;

an upper DBS signal path that includes:
  a) an initial path portion which passes signals in said upper DBS signal band and attenuates signals in said CATV signal band and said lower DBS signal band;
  b) a final path portion which passes signals in said lower DBS signal band and attenuates signals in said upper DBS signal band; and
  c) a downconverter that converts signals in said upper DBS signal band to said lower DBS signal band, said downconverter coupled between said initial and final path portions; and a switch system that couples either selected one of said lower and upper DBS signal paths between said diplexer and said DBS output port.

9. The interface module of claim 8, wherein said CATV signal path includes a low-pass filter that passes signals in said CATV signal band and attenuates signals in said lower and upper DBS signal bands.

10. The interface module of claim 8, wherein said lower DBS signal path includes a high-pass filter that passes signals in said lower DBS signal band and attenuates signals in said CATV signal band.

11. The interface module of claim 8, wherein said lower DBS signal path includes a band-pass filter that passes signals in said lower DBS signal band and attenuates signals in said CATV signal band and said upper DBS signal band.

12. The interface module of claim 8, wherein said initial path portion includes a high-pass filter that passes signals in said upper DBS signal band and attenuates signals in said CATV signal band and said lower DBS signal band.

13. The interface module of claim 8, wherein said final path portion includes a bandpass filter that passes signals in said lower DBS signal band and attenuates signals in said CATV signal band and said upper DBS signal band.

14. The interface module of claim 8, wherein said downconverter includes:

a mixer; and an oscillator coupled to said mixer and having a signal frequency lower than a low-pass filter coupling said oscillator and said mixer.

15. The interface module of claim 8, wherein said CATV signal band is the frequency band of 5–750 MHz, said lower DBS signal band is the frequency band of 950–1450 MHz and said upper DBS signal band is the frequency band of 1525–2025 MHz.

16. An interface module for coupling combined signals in lower and upper intermediate-frequency direct broadcast satellite (DBS) signal bands to a television receiver, the interface module comprising:

an input port for receiving said combined signals;

an output port;

a lower DBS signal path that passes signals in said lower DBS signal band and attenuates signals in said CATV signal band and said upper DBS signal band;

an upper DBS signal path that includes:
  a) an initial path portion which passes signals in said upper DBS signal band and attenuates signals in said CATV signal band and said lower DBS signal band;

b) a final path portion which passes signals in said lower DBS signal band and attenuates signals in said upper DBS signal band; and c) a downconverter that converts signals in said upper DBS signal band to said lower DBS signal band, said downconverter coupled between said initial and final path portions; and a switch system that selectively couples said lower and upper DBS signal paths between said diplexer and said DBS output port.

17. The interface module of claim 16, wherein said downconverter includes:

a mixer; and an oscillator coupled to said mixer and having a signal frequency lower than a low-pass filter coupling said oscillator and said mixer.

18. The interface module of claim 16, wherein said CATV signal band is the frequency band of 5–750 MHz, said lower DBS signal band is the frequency band of 950–1450 MHz and said upper DBS signal band is the frequency band of 1525–2025 MHz.

19. A receiving and distributing system for coupling combined signals in a cable television (CATV) signal band and lower and upper intermediate-frequency direct broadcast satellite (DBS) signal bands to a plurality of television receivers, the system comprising:

an antenna;

a dual-band, low noise block downconverter (LNB) coupled to said antenna;

a plurality of interface modules that each comprises:

a diplexer having an input port for receiving said combined signals;

a CATV output port;

a DBS output port;

a CATV signal path between said diplexer and said CATV output port that passes signals in said CATV signal band and attenuates signals in said lower and upper DBS signal bands;

a lower DBS signal path that passes signals in said lower DBS signal band and attenuates signals in said CATV signal band and said upper DBS signal band;

an upper DBS signal path that includes:

a) an initial path portion which passes signals in said upper DBS signal band and attenuates signals in said CATV signal band and said lower DBS signal band;

b) a final path portion which passes signals in said lower DBS signal band and attenuates signals in said upper DBS signal band; and c) a downconverter that converts signals in said upper DBS signal band to said lower DBS signal band, said downconverter coupled between said initial and final path portions; and a switch system that selectively couples said lower and upper DBS signal paths between said diplexer and said DBS output port; and a single-cable distribution network that connects said LNB and each of said interface modules.

20. A receiving and distributing system for coupling combined signals in lower and upper intermediate-frequency direct broadcast satellite (DBS) signal bands to a plurality of television receivers, the system comprising:

an antenna;

a dual-band, low noise block downconverter (LNB) coupled to said antenna;

a plurality of interface modules that each comprises:

an input port for receiving said combined signals;

an output port;

a lower DBS signal path that passes signals in said lower DBS signal band and attenuates signals in said CATV signal band and said upper DBS signal band;

an upper DBS signal path that includes:

a) an initial path portion which passes signals in said upper DBS signal band and attenuates signals in said CATV signal band and said lower DBS signal band;

b) a final path portion which passes signals in said lower DBS signal band and attenuates signals in said upper DBS signal band; and c) a downconverter that converts signals in said upper DBS signal band to said lower DBS signal band, said downconverter coupled between said initial and final path portions; and a switch system that selectively couples said lower and upper DBS signal paths between said diplexer and said DBS output port; and a single-cable distribution network that connects said LNB and each of said interface modules.

* * * * *